US012796011B2

(12) United States Patent
Cheng

(10) Patent No.: US 12,796,011 B2
(45) Date of Patent: Nov. 10, 2026

(54) SEMICONDUCTOR STRUCTURE AND METHOD FOR MANUFACTURING SEMICONDUCTOR STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 601 days.

(21) Appl. No.: 18/449,434

(22) Filed: Aug. 14, 2023

(65) Prior Publication Data

US 2024/0063260 A1 Feb. 22, 2024

(30) Foreign Application Priority Data

Aug. 16, 2022 (CN) ......................... 202210981261.0

(51) Int. Cl.
*H10D 62/10* (2025.01)
*H10D 8/01* (2025.01)
(Continued)

(52) U.S. Cl.
CPC ........... *H10D 62/104* (2025.01); *H10D 8/051* (2025.01); *H10D 8/60* (2025.01); *H10D 30/015* (2025.01);
(Continued)

(58) Field of Classification Search
CPC ............. H10D 62/104; H10D 62/8503; H10D 30/015; H10D 30/475; H10D 8/051; H10D 8/60; H10P 50/691; H10P 50/646
(Continued)

(56) References Cited

U.S. PATENT DOCUMENTS

2010/0159656 A1* 6/2010 Nakata ................. H10D 30/477 257/E21.409
2021/0343834 A1* 11/2021 Lichtenwalner ..... H10D 62/109
2022/0406918 A1* 12/2022 Cheng .................... H10D 8/051

FOREIGN PATENT DOCUMENTS

CN 1423836 A 6/2003
CN 109244122 A 1/2019
(Continued)

OTHER PUBLICATIONS

State Intellectual Property Office of the People's Republic of China, Office Action and Search Report Issued in Application No. 2022109812610, May 14, 2026, 13 pages. (Submitted with English Translation).

*Primary Examiner* — Igwe U Anya
(74) *Attorney, Agent, or Firm* — Carroll, Hoette & Butscher, LLC; Christopher R. Carroll

(57) ABSTRACT

The present disclosure provides a semiconductor structure and a manufacturing method of the semiconductor, including: a first semiconductor layer, where first protrusions are at a first surface of the first semiconductor layer; and a second semiconductor layer on the first semiconductor layer, where second protrusions are at a surface of the second semiconductor layer away from the first semiconductor layer, the second protrusions correspond to the first protrusions. A conductivity type of the second semiconductor layer is the same as a conductivity type of the first semiconductor layer, and a doping concentration of the second semiconductor layer is lower than a doping concentration of the first semiconductor layer. The third semiconductor layer is on the second semiconductor layer, and a conductivity type of the third semiconductor layer is opposite to the conductivity type of the first semiconductor layer.

19 Claims, 7 Drawing Sheets

(51) Int. Cl.

| | |
|---|---|
| ***H10D 8/60*** | (2025.01) |
| ***H10D 30/01*** | (2025.01) |
| ***H10D 30/47*** | (2025.01) |
| ***H10D 62/85*** | (2025.01) |
| ***H10P 50/00*** | (2026.01) |
| ***H10P 50/64*** | (2026.01) |

(52) U.S. Cl.
CPC ....... *H10D 30/475* (2025.01); *H10D 62/8503* (2025.01); *H10P 50/646* (2026.01); *H10P 50/691* (2026.01)

(58) Field of Classification Search
USPC ............................................................ 257/76
See application file for complete search history.

(56) References Cited

FOREIGN PATENT DOCUMENTS

| | | | |
|---|---|---|---|
| CN | 113113496 | A | 7/2021 |
| JP | 2015130388 | A | 7/2015 |
| WO | 2021139366 | A1 | 7/2021 |

* cited by examiner

SEMICONDUCTOR STRUCTURE AND METHOD FOR MANUFACTURING SEMICONDUCTOR STRUCTURE

CROSS REFERENCE TO RELATED APPLICATIONS

This application claims priority to Chinese Patent Application No. 2022109812610 entitled "semiconductor structure and method for manufacturing semiconductor structure" filed on Aug. 16, 2022, the entire content of which is incorporated herein by reference.

TECHNICAL FIELD

The present disclosure relates to the field of semiconductor technologies, and in particular to a semiconductor structure and a method for manufacturing the semiconductor structure.

BACKGROUND

With the development of technologies, semiconductor structures have attracted more and more attentions.

Schottky diode is an important semiconductor structure, which has advantages of good reliability and easy circuit design, and the Schottky diode is widely used in fields of power electronics, microwave radio frequency, etc. An important technical index of Schottky diodes is the diode reverse breakdown voltage, which limits a performance and a reliability of a device. When manufacturing vertical Schottky diodes, many factors will affect the reverse breakdown voltage. For example, when using an etching process, the interface may be damaged and interface impurities may be introduced.

SUMMARY

A purpose of the present disclosure is providing a method for manufacturing a semiconductor structure to avoid introduction of interface impurities.

According to an aspect of the present disclosure, a semiconductor structure is provided, including:

- a first semiconductor layer, where the first semiconductor layer includes a first surface and a second surface which are opposite to each other, and first protrusions at the first surface;
- a second semiconductor layer on the first surface of the first semiconductor, where the second semiconductor layer includes second protrusions at a surface of the second semiconductor layer away from the first semiconductor layer, the second protrusions correspond to the first protrusions respectively in position, a second recess is between two adjacent second protrusions of the second protrusions, a conductivity type of the second semiconductor layer is the same as a conductivity type of the first semiconductor layer, and a doping concentration of the second semiconductor layer is lower than a doping concentration of the first semiconductor layer; and
- a third semiconductor layer on the second semiconductor layer, where a conductivity type of the third semiconductor layer is opposite to the conductivity type of the first semiconductor layer.

According to an aspect of the present disclosure, a method for manufacturing a semiconductor structure is provided, including:

- providing a first semiconductor layer, where the first semiconductor layer includes a first surface and a second surface which are opposite to each other, and first protrusions are formed at the first surface;
- forming a second semiconductor layer covering the first surface, where second protrusions are formed at a surface of the second semiconductor layer away from the first semiconductor layer, the second protrusions correspond to the first protrusions respectively, a second recess is formed between two adjacent second protrusions of the second protrusions, a conductivity type of the second semiconductor layer is the same as a conductivity type of the first semiconductor layer, and a doping concentration of the second semiconductor layer is lower than a doping concentration of the first semiconductor layer; and
- forming a third semiconductor layer covering the second semiconductor layer, where a conductivity type of the third semiconductor layer is opposite to the conductivity type of the first semiconductor layer.

According to embodiments of the present disclosure, the semiconductor structure and the method for manufacturing the semiconductor structure are provided. The second semiconductor layer is on the first surface of the first semiconductor layer, and since the first protrusions are formed at the first surface, the second protrusions are formed at a surface of the second semiconductor layer away from the first semiconductor layer. Compared with a method of forming the second protrusion by etching, the second semiconductor layer is prevented from being damaged by etching, thereby preventing an interface between the second semiconductor layer and the third semiconductor layer from being damaged, such that introduction of impurities at the interface can be avoided.

BRIEF DESCRIPTION OF DRAWINGS

FIG. 1(*b*), FIG. 1(*c*) and FIG. 1(*e*) are top views of the structure shown in FIG. 1(*a*).

FIG. 1(*d*) and FIG. 1(*f*) are top views of a first semiconductor layer in FIG. 1(*a*).

DETAILED DESCRIPTION

The exemplary embodiments will be described herein in detail, examples of which are represented in the accompanying drawings. When the following descriptions involve the drawings, like numerals in different drawings refer to like or similar elements unless otherwise indicated. The embodiments described in the following exemplary embodiments do not represent all embodiments consistent with the present application. Rather, they are only examples of devices and methods that are consistent with some aspects of the present application, as detailed in the appended claims.

The terms used in the present disclosure are for the purpose of describing specific embodiments only and are not intended to limit the present disclosure. Unless otherwise defined, technical terms or scientific terms used in the present disclosure shall have their ordinary meanings as understood by those of ordinary skills in the field to which the present disclosure belongs. The "first", "second" and similar words used in the specification and claims of the present disclosure do not indicate any order, quantity or importance, but are only used to distinguish different components. Similarly, similar words such as "a" or "an" do not mean quantity limitation but mean that there is at least one. "Multiple" or "a plurality of" means two or more. Unless otherwise specified, similar words such as "front", "rear", "lower" and/or "upper" are only for convenience of explanation and are not limited to a position or a spatial orientation. Similar words such as "include" or "comprise" mean that the elements or objects appear before "include" or "comprise" cover the elements or objects listed after "include" or "comprise" and their equivalents, but do not exclude other elements or objects. Similar words such as "connect" or "couple" are not limited to physical or mechanical connection, but may include electrical connection, whether direct or indirect. Singular forms "a", "the" and "said" used in the specification of the present disclosure and the appended claims are also intended to include plural forms, unless the context clearly indicates other meaning. It should also be understood that the term "and/or" as used herein refers to and includes any or all possible combinations of one or more associated listed items.

According to an embodiment of the present disclosure, a method for manufacturing a semiconductor structure is provided. FIG. 1 (*a*) is a schematic diagram of a structure after forming a second semiconductor layer 2 according to an embodiment of the present disclosure.

Figure 1A:
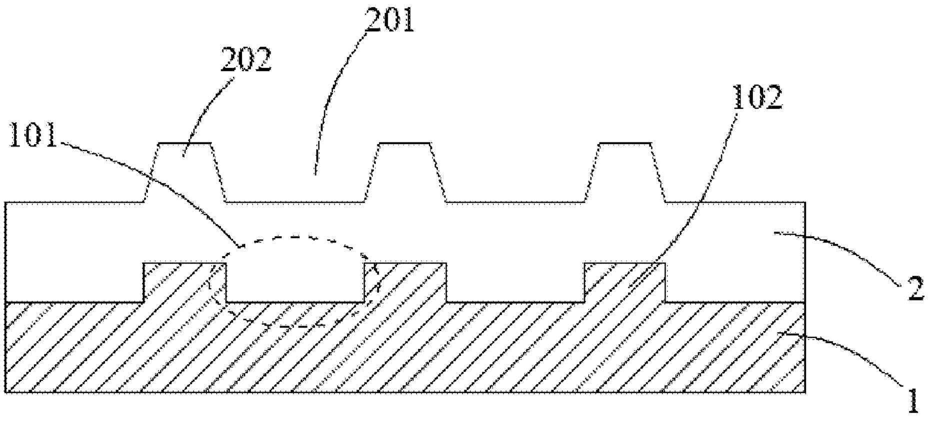
FIG. 1 (*a*) is a schematic diagram of a structure after forming a second semiconductor layer according to an embodiment of the present disclosure.
Figure 1B:
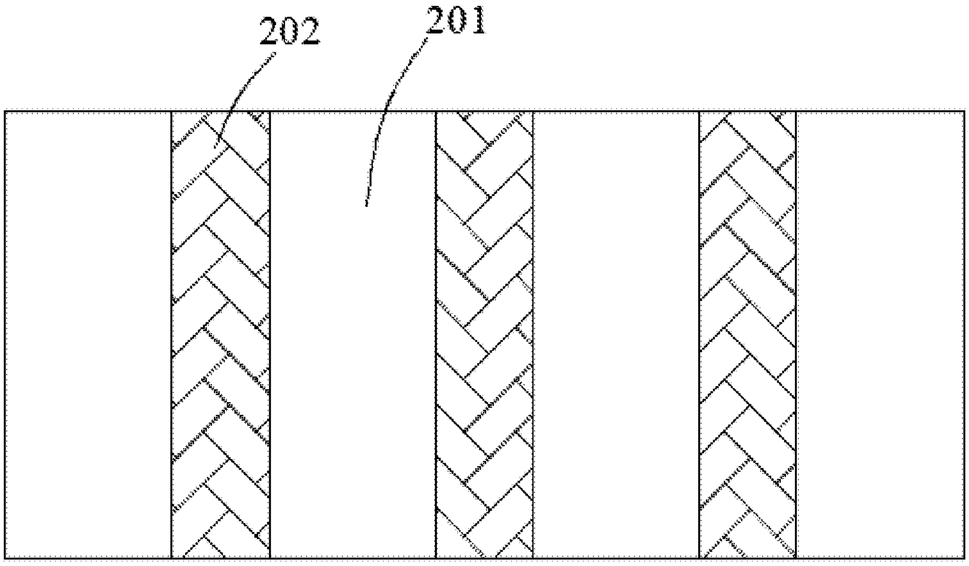
Figure 1C:
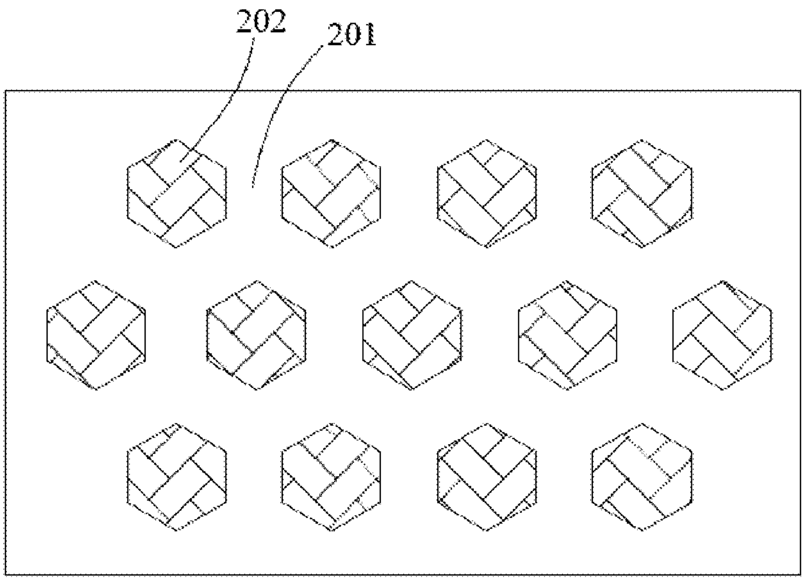
Figure 1D:
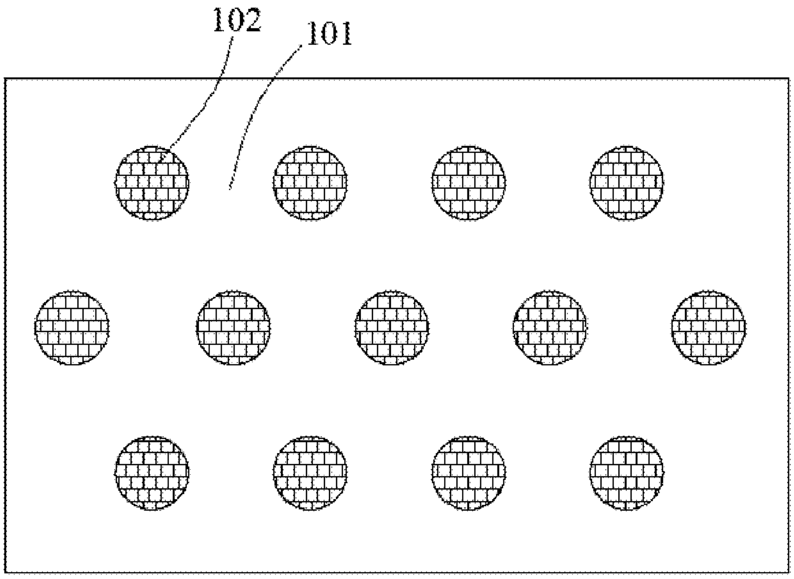
Figure 1E:
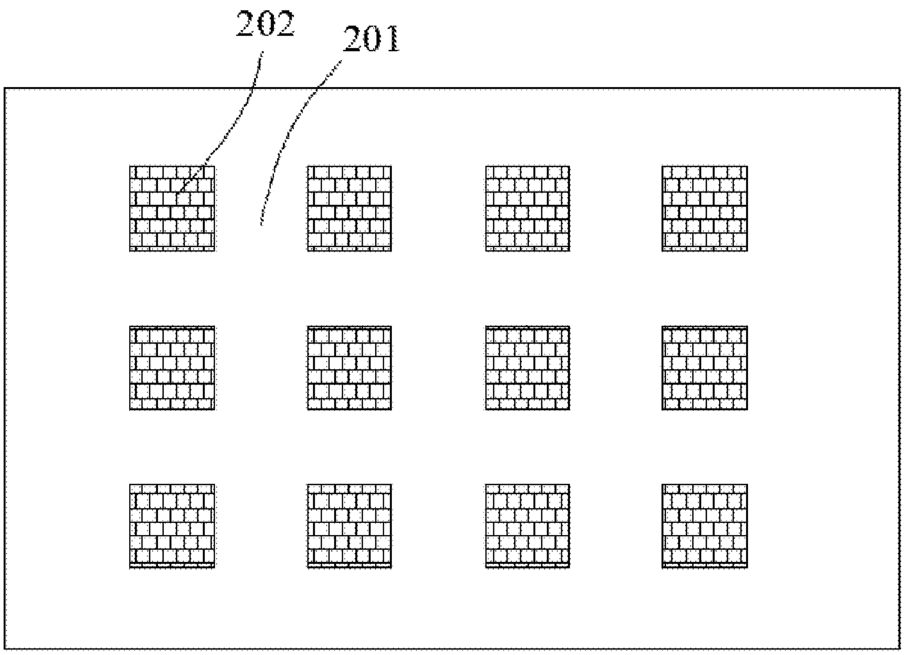
Figure 1F:
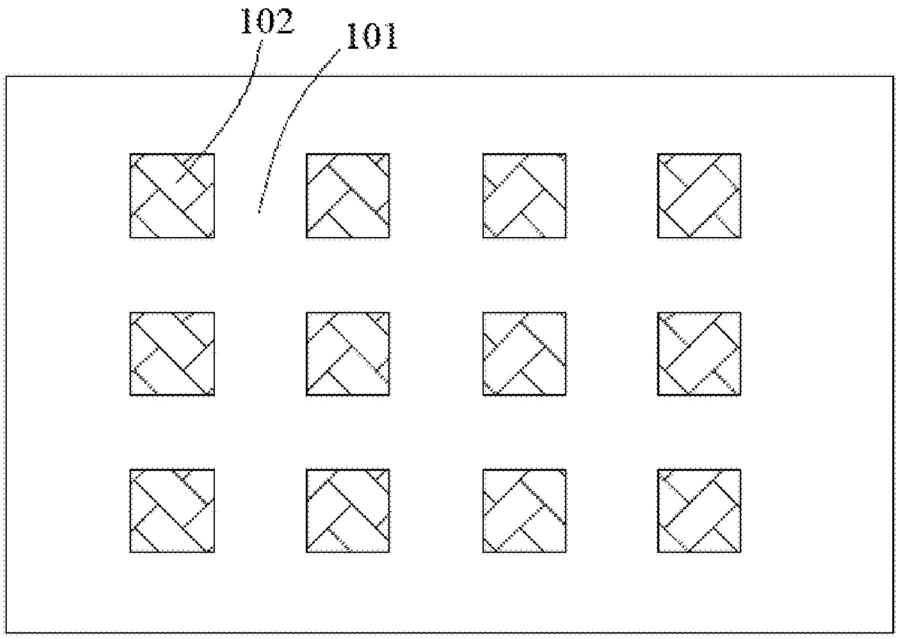
Figure 2:
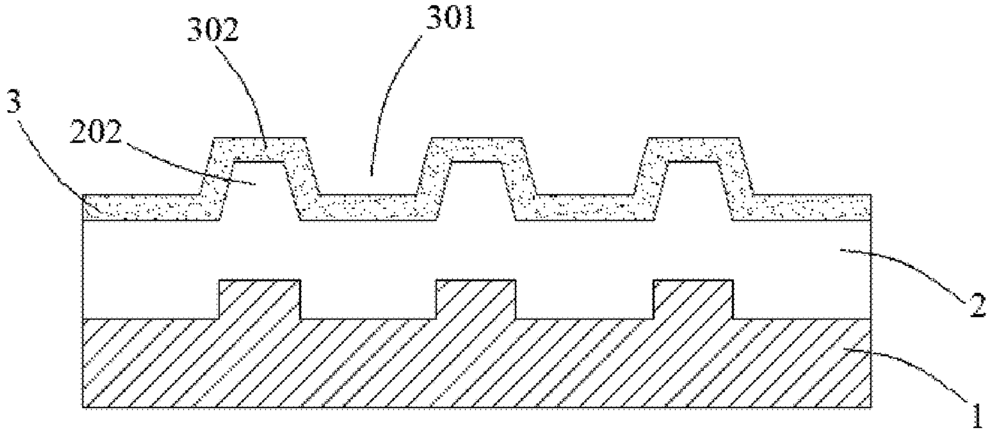
FIG. 2 is a schematic diagram of a structure after forming a third semiconductor layer according to an embodiment of the present disclosure.
Figure 3:
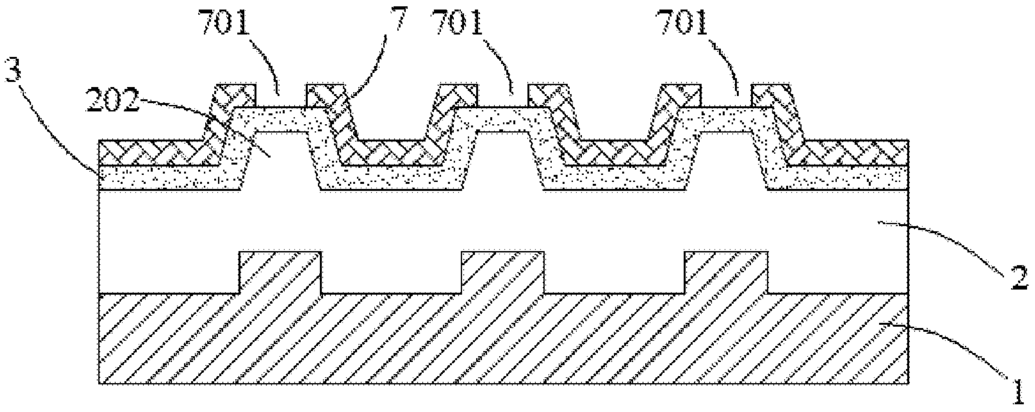
FIG. 3 is a schematic diagram of a structure after forming a mask layer according to an embodiment of the present disclosure.
Figure 4:
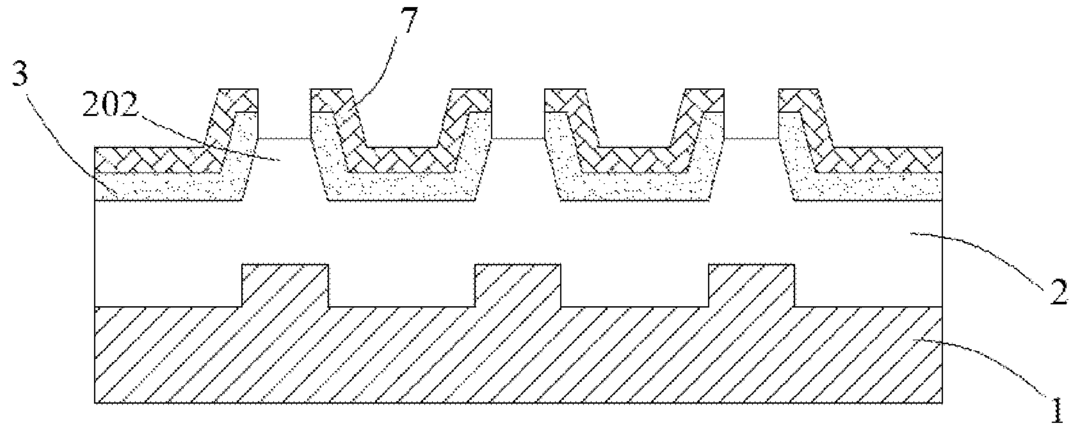
FIG. 4 is a schematic diagram of the semiconductor structure which is manufactured according to an embodiment of the present disclosure.

FIG. 1(*b*), FIG. 1(*c*) and FIG. 1(*e*) are top views of the structure shown in FIG. 1(*a*). FIG. 1(*d*) and FIG. 1(*f*) are top views of the first semiconductor layer 1 in FIG. 1(*a*). FIG. 2 is a schematic diagram of a structure after forming a third semiconductor layer 3 according to an embodiment of the present disclosure. FIG. 3 is a schematic diagram of a structure after forming a mask layer 7 according to an embodiment of the present disclosure. FIG. 4 is a schematic diagram of the semiconductor structure which is manufactured according to an embodiment of the present disclosure. The method for manufacturing the semiconductor structure may include step S100-step S120.

At step S100, a first semiconductor layer 1 is provided, where the first semiconductor layer 1 includes a first surface and a second surface which are opposite to each other, and first protrusions 102 are formed at the first surface.

At step S110, a second semiconductor layer 2 covering the first surface is formed, where second protrusions 202 are formed at a surface of the second semiconductor layer 2 away from the first semiconductor layer 1, the second protrusions 202 correspond to the first protrusions 102 respectively in position, a second recess 201 is formed between two adjacent second protrusions 202; a conductivity type of the second semiconductor layer 2 is the same as a conductivity type of the first semiconductor layer 1, and a doping concentration of the second semiconductor layer 2 is lower than a doping concentration of the first semiconductor layer 1.

At step S120, a third semiconductor layer 3 covering the second semiconductor layer 2 is formed, where a conductivity type of the third semiconductor layer 3 is opposite to the conductivity type of the first semiconductor layer 1.

In the method for manufacturing the semiconductor structure according to an embodiment of the present disclosure, the second semiconductor layer 2 is formed at the first surface of the first semiconductor layer 1, and since the first protrusions 101 are formed at the first surface, the second protrusions 102 are formed at a surface of the second semiconductor layer 2 away from the first semiconductor layer 1. Compared with a method of forming the second protrusion 202 by etching, the second semiconductor layer 2 is prevented from being damaged by etching, such that a damage at an interface of the second semiconductor layer 2 and the third semiconductor layer 3 may be avoided, and the introduction of impurities at the interface can be avoided.

According to the embodiments of the present disclosure, each step of the method for manufacturing the semiconductor structure will be described in detail as follows.

At step S100, a first semiconductor layer 1 is provided. The first semiconductor layer 1 includes a first surface and a second surface which are opposite to each other, and first protrusions 102 are formed at the first surface.

As shown in FIG. 1(*a*), a material of the first semiconductor layer 1 may be a III-V group compound. Specifically, the material of the first semiconductor layer 1 may be at least one of Si, SiC, GaN, $Ga_2O_3$, AlGaN, InGaN, or AlInGaN. The first semiconductor layer 1 may be doped with n-type ions, so that the first semiconductor layer 1 is an n-type semiconductor layer. The n-type ions may be at least one of Si ions, Ge ions, Sn ions, Se ions or Te ions. The concentration of n-type ions doped in the first semiconductor layer 1 is relatively large, so that the first semiconductor layer 1 is an n-type heavily doped layer, and the doping concentration of impurity ions in the first semiconductor layer 1 can be greater than $10^{18}/cm^3$. The first semiconductor layer 1 may be a single layer structure, or a laminated layer structure, and the material of each layer may be GaN, AlGaN or AlInGaN, or other semiconductor materials including Ga atom and N atom, or a combination thereof. Certainly, the first semiconductor layer 1 may be a p-type semiconductor layer. The first surface and the second surface may be two opposite surfaces in the thickness direction of the first semiconductor layer 1.

The number of the first protrusions 102 may be multiple, and the first protrusions 102 are disposed apart. The horizontal projection of the first protrusion 102 may be a circle, or certainly, the horizontal projection of the first protrusion 102 may be in other shapes such as a strip, a rectangle, etc. As shown in FIG. 1 (*d*), first protrusions 102 whose horizontal projections are circular may be disposed in a hexagon. As shown in FIG. 1 (*f*), first protrusions 102 whose horizontal projections are rectangular may be disposed in a matrix. Taking a strip-shaped first protrusion 102 as an example, the first protrusions 102 may be disposed in parallel and distributed apart. Forming the first protrusions 102 at the first surface may include: growing the first semiconductor layer 1 conformally at a surface of a patterned substrate and removing the substrate to form the first protrusions 102 of the first semiconductor layer 1. In other embodiments of the present disclosure, the first protrusions 102 may also be formed by etching the first surface according to the present disclosure. In addition, a first recess 101 is formed between two adjacent first protrusions 102.

At step S110, a second semiconductor layer 2 covering the first surface is formed, where second protrusions 202 are formed at a surface of the second semiconductor layer 2 away from the first semiconductor layer 1, the second protrusions 202 correspond to the first protrusions 102 respectively in position, and a second recess 201 is formed between two adjacent second protrusions 202. A conductivity type of the second semiconductor layer 2 is the same as a conductivity type of the first semiconductor layer 1, and a doping concentration of the second semiconductor layer 2 is lower than a doping concentration of the first semiconductor layer 1.

The material of the second semiconductor layer 2 may be a III-V group compound. Specifically, the material of the second semiconductor layer 2 may be at least one of Si, SiC, GaN, $Ga_2O_3$, AlGaN, InGaN, or AlInGaN. The conductivity type of the second semiconductor layer 2 is the same as the conductivity type of the first semiconductor layer 1. Taking the first semiconductor layer 1 as an N-type semiconductor layer as an example, the second semiconductor layer 2 is also an N-type semiconductor layer. Taking the first semiconductor layer 1 as a P-type semiconductor layer as an example, the second semiconductor layer 2 is also a P-type semiconductor layer. The doping concentration of the second semiconductor layer 2 is lower than the doping concentration of the first semiconductor layer 1. Taking the first semiconductor layer 1 as an N-type heavily doped layer as an example, the second semiconductor layer 2 may be an N-type lightly doped layer, and the doping concentration of impurity ions in the second semiconductor layer 2 may be less than $10^{18}/cm^3$. The second semiconductor layer 2 may be a single layer structure, or a laminated layer structure, and the material of each layer may be GaN, AlGaN or AlInGaN, or other semiconductor materials including Ga atom and N atom, or a combination thereof.

The number of the first protrusions 202 may be multiple. Further, the number of the second protrusions 202 may be the same as the number of the first protrusions 102, but this is not particularly limited in the embodiment of the present disclosure. Taking a horizontal projection of the first protrusion 102 as a strip as an example, as shown in FIG. 1 (*b*), the horizontal projection of the second protrusion 202 may also be a strip. Taking the horizontal projection of the first protrusion 102 as a circle as an example, as shown in FIG. 1(*c*), a horizontal projection of the second protrusion 202 may be a hexagon and the second protrusions 202 are disposed in a hexagon. Taking a horizontal projection of the first protrusion 102 as a rectangle as an example, as shown in FIG. 1 (*e*), a horizontal projection of the second protrusion 202 may be a rectangular and disposed in a matrix. Taking a horizontal projection of the first protrusion 202 as a strip as an example, the second protrusions 202 may be disposed in parallel and distributed apart. A second recess 201 is formed between two adjacent second protrusions 202. A horizontal width of the strip-shaped first protrusion 102 can be greater than a horizontal width of the strip-shaped second protrusion 202, or certainly, the horizontal width of the strip-shaped first protrusion 102 may be smaller than the horizontal width of the strip-shaped second protrusion 202. The second semiconductor layer 2 may be formed by epitaxial growth, which is not limited in the embodiments of the present disclosure. During the epitaxial growth process of the second semiconductor layer 2, the second protrusion 202 may be conformally formed, so that the etching steps can be reduced by forming the second protrusion 202 during the growth process of the second semiconductor layer 2, thereby reducing the inhomogeneity caused by etching and the impact of etching on the epitaxial layer, and thus the theoretical purpose of the design can be achieved. In the process of reducing defects, the conductive conditions are reduced, that is, the carriers are reduced, which is further improve the reverse breakdown voltage.

At step S120, a third semiconductor layer 3 covering the second semiconductor layer 2 is formed.

As shown in FIG. 2, a material of the first semiconductor layer 3 may be a III-V group compound, for example, the material of the third semiconductor layer 3 may be at least one of Si, SiC, GaN, $Ga_2O_3$, AlGaN, InGaN, or AlInGaN. A conductivity type of the third semiconductor layer 3 is different from the conductivity type of the first semiconductor layer 1. Taking the first semiconductor layer 1 as an N-type semiconductor layer as an example, the third semiconductor layer 3 is a P-type semiconductor layer. Taking the first semiconductor layer 1 as a P-type semiconductor layer as an example, the third semiconductor layer 3 is a N-type semiconductor layer. The third semiconductor layer 3 may be a single layer structure, or a laminated layer structure, and the material of each layer may be GaN, AlGaN or AlInGaN, or other semiconductor materials including Ga atom and N atom, or a combination thereof. In other embodiments of the present disclosure, the material of the third semiconductor layer 3 may also include NiO, ITO, etc.

Third protrusions 302 are conformally formed at a surface of the third semiconductor layer 3 away from the second semiconductor layer 2, and the third protrusions 302 correspond to the second protrusions 202 respectively in position. Certainly, in other embodiments, the surface of the third semiconductor layer 3 away from the second semiconductor layer 2 may be a plane, and the second recess 201 may be filled up with the third semiconductor layer 3, but the present disclosure does not make any special limitation thereto.

The number of the third protrusions 302 may be multiple. Further, the number of the third protrusions 302 may be the same as the number of the second protrusions 202, but this is not particularly limited in the embodiment of the present disclosure. The horizontal projection of the third protrusion 302 may be in a shape of a strip. Taking the number of third protrusions 302 as multiple as an example, the strip-shaped third protrusions 302 may be disposed in parallel and distributed apart. The horizontal width of the strip-shaped second protrusion 202 may be greater than the horizontal width of the strip-shaped third protrusion 302, or certainly, the horizontal width of the strip-shaped second protrusion 202 may be smaller than the strip-shaped third protrusion 302. In addition, a third recess 301 is formed between two adjacent third protrusions 302.

The third semiconductor layer 3 may be formed by epitaxial growth, which is not limited in the embodiments of the present disclosure. The third protrusion 302 may be conformally formed during the epitaxial growth process of the third semiconductor layer 3.

According to an embodiment of the present disclosure, a method for manufacturing the semiconductor structure may further include steps as following.

At step S130, a portion of the third semiconductor layer 3 is etched to expose a top surface of the second protrusion 202.

Specifically, step S130 may include steps as following.

At step S1301, as shown in FIG. 3, a mask layer 7 covering the third semiconductor layer 3 is formed.

The material of the mask layer 7 may be an insulating material, such as $SiO_2$. The mask layer 7 may be manufactured by vapor deposition. The mask layer 7 may conformally cover the third semiconductor layer 3, but this is not particularly limited in the embodiments of the present disclosure.

At step S1302, an opening 701 is formed on the mask layer 7, where the opening 701 exposes a portion of the third semiconductor layer 3 located on the top surface of the second protrusion 202.

The opening 701 may be formed by etching. The area of the opening 701 may be smaller than the area of the top surface of the second protrusion 202, or certainly, the area of the opening 701 may be greater than or equal to the area of the top surface of the second protrusion 202. In the present disclosure, a portion of the third semiconductor layer 3 located on the top surface of the second protrusion 202 is exposed by etching, which has high efficiency and reduces the manufacturing time.

At step S1303, as shown in FIG. 4, a portion of the third semiconductor layer 3 located at the top surface of the second protrusion 202 is etched to expose the top surface of the second protrusion 202.

Using the mask layer 7 with the opening 701 as a mask, the portion of the third semiconductor layer 3 located on the top surface of the second protrusion 202 is etched. In the embodiments of the present disclosure, the mask layer 7 may be removed, or certainly, the mask layer 7 may be retained.

According to an embodiment of the present disclosure, a semiconductor structure is provided which may be formed by the above-mentioned method for manufacturing the semiconductor structure. The semiconductor structure may include: a first semiconductor layer 1 including a first surface and a second surface which are opposite to each other, where the first surface has first protrusions 102; a second semiconductor layer 2 on the first semiconductor layer 1, where second protrusions 202 are conformally formed at a surface of the second semiconductor layer 2 away from the first semiconductor layer 1, the second protrusions 202 correspond to the first protrusions 102 respectively in position, a second recess 201 is formed between two adjacent second protrusions 202, a conductivity type of the second semiconductor layer 2 is the same as a conductivity type of the first semiconductor layer 1, and a doping concentration of the second semiconductor layer 2 is lower than a doping concentration of the first semiconductor layer 1; and a third semiconductor layer 3 on the second semiconductor layer 2, where the second protrusion is exposed by the third semiconductor layer 3.

According to the embodiment of the present disclosure, the method for manufacturing the semiconductor structure is belong to the same inventive concept as the semiconductor structure, and the descriptions of related details and beneficial effects can be referred to each other and will not be repeated here.

Figure 5:
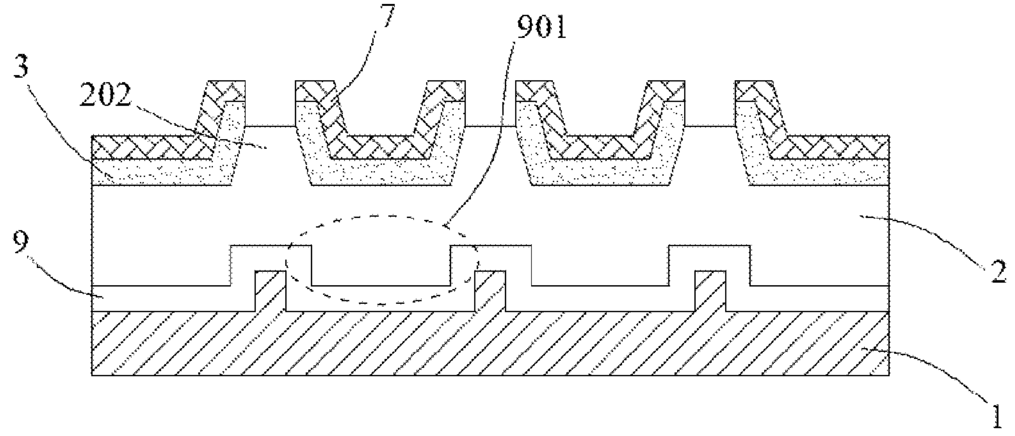
FIG. 5 is a schematic diagram of the semiconductor structure which is manufactured according to an embodiment of the present disclosure.

FIG. 5 is a schematic diagram of the semiconductor structure which is manufactured according to an embodiment of the present disclosure. The semiconductor structure and the method for manufacturing semiconductor structure in this embodiment are substantially the same as the semiconductor structure and the method for manufacturing the semiconductor structure in the above-mentioned embodiment, the difference is that before step S110, the method for manufacturing the semiconductor structure further includes: forming a buffer layer 9 covering the first surface of the first semiconductor layer 1, where the second semiconductor layer 2 is formed on a side of the buffer layer 9 away from the first semiconductor layer 1.

A conductivity type of the buffer layer 9 is the same as the conductivity type of the first semiconductor layer 1. For example, the buffer layer 9 is an N-type buffer layer. A material of the buffer layer 9 may be GaN, AlGaN or AlInGaN, or other semiconductor materials including Ga atoms and N atoms, or a combination thereof. A buffer-layer-recess 901 is formed at the surface of the buffer layer 9 away from the first semiconductor layer 1, and the buffer-layer-recess 901 corresponds to the first recess 101 in position. The buffer layer 9 may be formed by epitaxial growth, which is not limited in the embodiments of the present disclosure.

The buffer-layer-recess 901 may be conformally formed during the epitaxial growth process of the buffer layer 9.

A conductivity type of the buffer layer 9 is opposite to the conductivity type of the first semiconductor layer 1. For example, the buffer layer 9 is a P-type buffer layer, and electrons are supplemented between the first semiconductor layer 1 and the second semiconductor layer 2 to form a depletion layer. The buffer layer 9 may be an alloy layer or a superlattice structure layer, as a barrier layer for impurities and defects.

It should be pointed out that the buffer layer 9 may be a single layer structure or a laminated layer structure.

Figure 6:
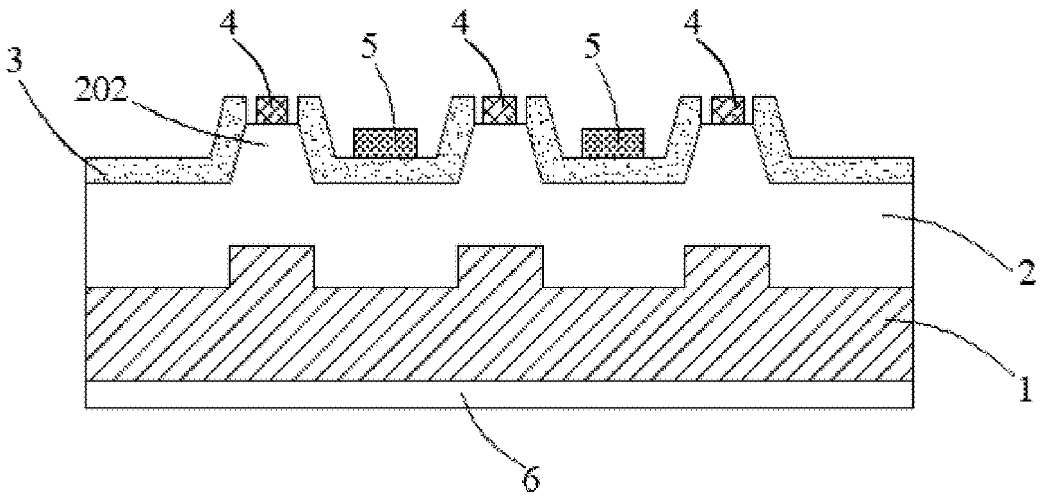
FIG. 6 is a schematic diagram of the semiconductor structure which is manufactured according to an embodiment of the present disclosure.

FIG. 6 is a schematic diagram of the semiconductor structure which is manufactured according to an embodiment of the present disclosure. The semiconductor structure and the method for manufacturing the semiconductor structure in this embodiment are substantially the same as the semiconductor structure and the method for manufacturing the semiconductor structure in the above-mentioned embodiment, the difference is that the method for manufacturing the semiconductor structure further includes: removing the mask layer 7; and forming the source electrode 4, the gate electrode 5 and the drain electrode 6. The source electrode 4 is on the top surface of the second protrusion 202 to be in contact with the second semiconductor layer 2, the gate electrode 5 is on the bottom surface of the third recess 301 to be in contact with the third semiconductor layer 3, the drain electrode 6 is disposed on the second surface of the first semiconductor layer 1.

Figure 7:
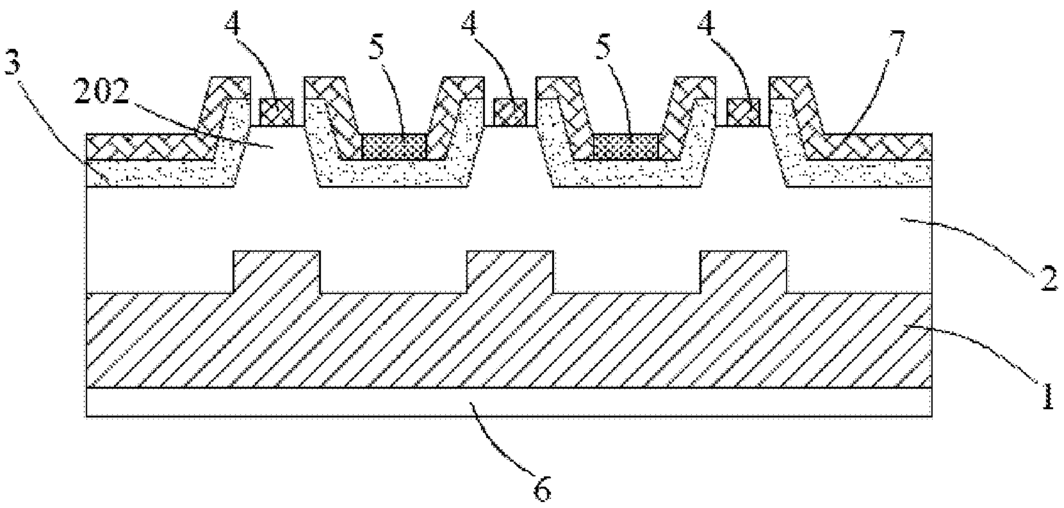
FIG. 7 is a schematic diagram of the semiconductor structure which is manufactured according to an embodiment of the present disclosure.

FIG. 7 is a schematic diagram of the semiconductor structure which is manufactured according to an embodiment of the present disclosure. The semiconductor structure and the method for manufacturing the semiconductor structure in this embodiment are substantially the same as the semiconductor structure and the method for manufacturing the semiconductor structure in the above-mentioned embodiments, the difference is that the manufacturing method further includes: forming an opening in the mask layer 7, where the opening exposes a portion of the third semiconductor layer 3 located at the bottom surface of the third recess 301; and forming a source electrode 4, a gate electrode 5 and a drain electrode 6, where the source electrode 4 is on the top surface of the second protrusion 202, the gate electrode 5 is on the bottom surface of the third recess 301, and the drain electrode 6 is disposed on the second surface of the first semiconductor layer 1. The opening can be formed by etching.

Figure 8:
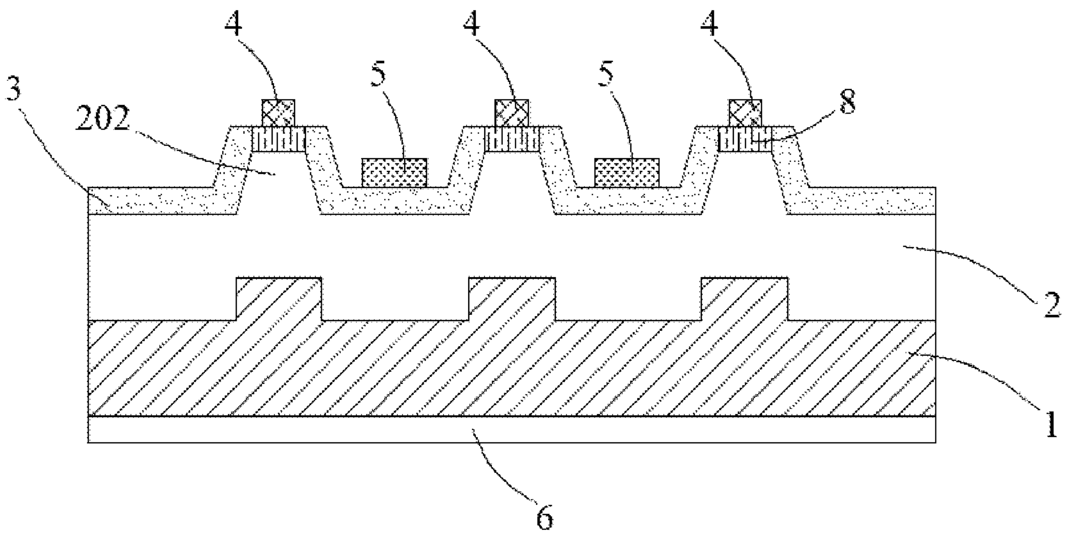
FIG. 8 is a schematic diagram of the semiconductor structure which is manufactured according to an embodiment of the present disclosure.

FIG. 8 is a schematic diagram of the semiconductor structure which is manufactured according to an embodiment of the present disclosure. The semiconductor structure and the method for manufacturing the semiconductor structure in this embodiment are substantially the same as the semiconductor structure and the method for manufacturing the semiconductor structure in the above-mentioned embodiments, the difference is that before forming the source electrode 4, the method for manufacturing the semiconductor structure of the semiconductor structure further includes: forming a fourth semiconductor layer 8 on the top surface of the second protrusion 202, where the third semiconductor layer 3 is mesh-shaped, a mesh hole corresponds to the second protrusion 202. The conductivity type of the fourth semiconductor layer 8 is the same as the conductivity the first semiconductor layer 1 and is opposite to the conductivity type of the third semiconductor layer 3. A material of the fourth semiconductor layer 8 is the same as the material of the first semiconductor layer 1, the second semiconductor layer 2 or the third semiconductor layer 3.

The source electrode 4 is formed on a side of the fourth semiconductor layer 8 away from the second protrusion 202. By providing the fourth semiconductor layer 8, a resistance of ohmic contact can be reduced.

Figure 9:
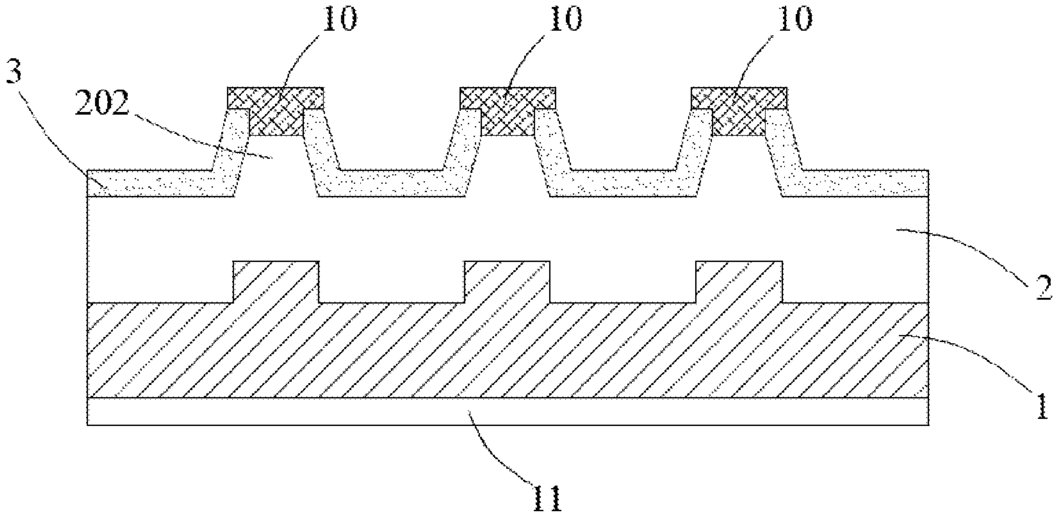
FIG. 9 is a schematic diagram of the semiconductor structure which is manufactured according to an embodiment of the present disclosure.

FIG. 9 is a schematic diagram of the semiconductor structure which is manufactured according to an embodiment of the present disclosure. The semiconductor structure and the method for manufacturing the semiconductor structure in this embodiment of the present disclosure are substantially the same as the semiconductor structure and the method for manufacturing the semiconductor structure in the above-mentioned embodiment, the difference is that the method for manufacturing the semiconductor structure further includes: forming a fist electrode 10 connecting the third semiconductor layer 3 on the top surface of the second protrusion 202; and forming a second electrode 11 on the second surface of the first semiconductor layer 1. Specifically, the first electrode 10 is an anode, the second electrode 11 is a cathode, and the anode contacts the second semiconductor layer 2 and the third semiconductor layer 3.

The above are some embodiments of the present disclosure, and they do not limit the present disclosure in any form. Although the present disclosure has been disclosed in the preferred embodiments, they are not used to limit the present disclosure. Those skilled in the art can make some changes or modifies into an equivalent embodiment by using the technical content disclosed above without departing from the scope of the technical solution of the present disclosure. So long as the content does not depart from the technical solution of the present disclosure, any simple changes, equivalent changes or modifications made to the above embodiments according to the technical essence of the present disclosure shall all belong to the scope of the technical solution of the present disclosure.

What is claimed is:

1. A semiconductor structure, comprising:

a first semiconductor layer, wherein the first semiconductor layer comprises a first surface and a second surface which are opposite to each other, and first protrusions at the first surface;

a second semiconductor layer on the first surface of the first semiconductor layer, wherein the second semiconductor layer comprises second protrusions at a surface of the second semiconductor layer away from the first semiconductor layer, the second protrusions correspond to the first protrusions respectively in position, a second recess is between two adjacent second protrusions of the second protrusions, a conductivity type of the second semiconductor layer is the same as a conductivity type of the first semiconductor layer, and a doping concentration of the second semiconductor layer is lower than a doping concentration of the first semiconductor layer; and a third semiconductor layer on the second semiconductor layer, wherein a conductivity type of the third semiconductor layer is opposite to the conductivity type of the first semiconductor layer;

wherein the third semiconductor layer comprises third protrusions corresponding to the second protrusions at a surface of the third semiconductor layer away from the second semiconductor layer.

2. The semiconductor structure according to claim 1, further comprising: a buffer layer between the first semiconductor layer and the second semiconductor layer.

3. The semiconductor structure according to claim 1, further comprising:

a fourth semiconductor layer on the second protrusions, wherein the third semiconductor layer is mesh-shaped, and a mesh hole corresponds to one of the second protrusions, a conductivity type of the fourth semiconductor layer is the same as the conductivity type of the first semiconductor layer, and is opposite to the conductivity type of the third semiconductor layer.

4. The semiconductor structure according to claim 3, further comprising:

a source electrode, a gate electrode and a drain electrode, wherein the source electrode is on the fourth semiconductor layer, the gate electrode is on a bottom surface of a third recess between the third protrusions of the third semiconductor layer, and the drain electrode is on the second surface of the first semiconductor layer.

5. The semiconductor structure according to claim 1, wherein a horizontal projection of one of the first protrusions is a circle, and after the second semiconductor layer is grown, a horizontal projection of one of the second protrusions is a hexagon.

6. The semiconductor structure according to claim 1, wherein the third semiconductor layer comprises third protrusions which are conformally formed at a surface of the third semiconductor layer away from the second semiconductor layer, wherein the third protrusions correspond to the second protrusions respectively in position, and the first protrusions, the second protrusions and the third protrusions are strip-shaped.

7. The semiconductor structure according to claim 1, further comprising:

a first electrode on a top surface of one of the second protrusions; and a second electrode on the second surface of the first semiconductor layer.

8. The semiconductor structure according to claim 1, further comprising:

a source electrode, a gate electrode and a drain electrode, wherein the third semiconductor layer is mesh-shaped, and a mesh hole corresponds to one of the second protrusions, the source electrode is on a top surface of one of the second protrusions exposed by the mesh hole, the gate electrode is on a bottom surface of a third recess between the third protrusions of the third semiconductor layer, and the drain electrode is at the second surface of the first semiconductor layer.

9. A method for manufacturing the semiconductor structure according to claim 1, comprising:

providing the first semiconductor layer, wherein the first semiconductor layer comprises the first surface and the second surface which are opposite to each other, and the first protrusions are formed at the first surface;

forming the second semiconductor layer covering the first surface, wherein second protrusions are formed at the surface of the second semiconductor layer away from the first semiconductor layer, the second protrusions correspond to the first protrusions respectively in position, the second recess is formed between two adjacent second protrusions of the second protrusions, the conductivity type of the second semiconductor layer is the same as the conductivity type of the first semiconductor layer, and the doping concentration of the second semiconductor layer is lower than the doping concentration of the first semiconductor layer; and forming the third semiconductor layer covering the second semiconductor layer, wherein the conductivity type of the third semiconductor layer is opposite to the conductivity type of the first semiconductor layer;

wherein the third protrusions are conformally formed at the surface of the third semiconductor layer away from the second semiconductor layer, and the third protrusions correspond to the second protrusions respectively in position.

10. The method according to claim 9, further comprising:

forming a mask layer covering the third semiconductor layer;

forming a first opening in the mask layer, wherein the first opening exposes a portion of the third semiconductor layer on a top surface of one of the second protrusions; and etching a portion of the third semiconductor layer on the top surface of the one of the second protrusions to expose the top surface of the second protrusions.

11. The method according to claim 10, further comprising:

forming a fourth semiconductor layer at the top surface of the one of the second protrusions.

12. The method according to claim 11, further comprising:

forming a third opening in the mask layer, wherein the third opening exposes a portion of the third semiconductor layer on a bottom surface of a third recess between the third protrusions of the third semiconductor layer; and forming a source electrode, a gate electrode and a drain electrode, wherein the source electrode is disposed on a surface of the fourth semiconductor layer away from the one of the second protrusions, the gate electrode is disposed at the bottom surface of the third recess of the third semiconductor layer, and the drain electrode is disposed at the second surface of the first semiconductor layer.

13. The method according to claim 10, further comprising:

removing the mask layer; and forming a source electrode, a gate electrode and a drain electrode, the source electrode is disposed at the top surface of the one of the second protrusions to be in contact with the second semiconductor layer, the gate electrode is disposed at a bottom surface of a third recess between the third protrusions of the third semiconductor layer to be in contact with the third semiconductor layer, and the drain electrode is disposed at the second surface of the first semiconductor layer.

14. The method according to claim 10, further comprising:

forming a second opening in the mask layer, wherein the second opening exposes a portion of the third semiconductor layer located on a bottom surface of a third recess between the third protrusions of the third semiconductor layer; and forming a source electrode, a gate electrode and a drain electrode, wherein the source electrode is disposed at a top surface of one of the second protrusions, the gate electrode is disposed at the bottom surface of the third recess of the third semiconductor layer, and the drain electrode is disposed at the second surface of the first semiconductor layer.

15. The method according to claim 9, wherein the first protrusions are formed at the first surface by:

etching the first surface to form the first protrusions; or conformally growing the first semiconductor layer at a patterned substrate to form the first protrusions at the first semiconductor layer.

16. The method according to claim 9, further comprising:

forming a first electrode in contact with the third semiconductor layer on a top surface of one of the second protrusions; and forming a second electrode on the second surface of the first semiconductor layer.

17. A semiconductor structure, comprising:

a first semiconductor layer, wherein the first semiconductor layer comprises a first surface and a second surface which are opposite to each other, and first protrusions at the first surface;

a second semiconductor layer on the first surface of the first semiconductor layer, wherein the second semiconductor layer comprises second protrusions at a surface of the second semiconductor layer away from the first semiconductor layer, the second protrusions correspond to the first protrusions respectively in position, a second recess is between two adjacent second protrusions of the second protrusions, a conductivity type of the second semiconductor layer is the same as a conductivity type of the first semiconductor layer, and a doping concentration of the second semiconductor layer is lower than a doping concentration of the first semiconductor layer;

a third semiconductor layer on the second semiconductor layer, wherein a conductivity type of the third semiconductor layer is opposite to the conductivity type of the first semiconductor layer; and a fourth semiconductor layer on the second protrusions, wherein the third semiconductor layer is mesh-shaped, and a mesh hole corresponds to one of the second protrusions, a conductivity type of the fourth semiconductor layer is the same as the conductivity type of the first semiconductor layer, and is opposite to the conductivity type of the third semiconductor layer.

18. The semiconductor structure according to claim 17, further comprising:

a source electrode, a gate electrode and a drain electrode, wherein the source electrode is on the fourth semiconductor layer, the gate electrode is on a bottom surface of a third recess between third protrusions of the third semiconductor layer, and the drain electrode is on the second surface of the first semiconductor layer.

19. A semiconductor structure, comprising:

a first semiconductor layer, wherein the first semiconductor layer comprises a first surface and a second surface which are opposite to each other, and first protrusions at the first surface;

a second semiconductor layer on the first surface of the first semiconductor layer, wherein the second semiconductor layer comprises second protrusions at a surface of the second semiconductor layer away from the first semiconductor layer, the second protrusions correspond to the first protrusions respectively in position, a second recess is between two adjacent second protrusions of the second protrusions, a conductivity type of the second semiconductor layer is the same as a conductivity type of the first semiconductor layer, and a doping concentration of the second semiconductor layer is lower than a doping concentration of the first semiconductor layer;

a third semiconductor layer on the second semiconductor layer, wherein a conductivity type of the third semiconductor layer is opposite to the conductivity type of the first semiconductor layer; and a source electrode, a gate electrode and a drain electrode, wherein the third semiconductor layer is mesh-shaped, and a mesh hole corresponds to one of the second protrusions, the source electrode is on a top surface of one of the second protrusions exposed by the mesh hole, the gate electrode is on a bottom surface of a third recess between third protrusions of the third semiconductor layer, and the drain electrode is at the second surface of the first semiconductor layer.

* * * * *